United States Patent
Pauly et al.

(10) Patent No.: US 10,732,405 B2
(45) Date of Patent: Aug. 4, 2020

(54) REFRACTIVE SURFACE

(71) Applicant: École Polytechnique Fédérale de Lausanne (EPFL), Lausanne (CH)

(72) Inventors: Mark Pauly, Lausanne (CH); Romain P. Testuz, Lausanne (CH); Yuliy Schwartzburg, Lausanne (CH)

(73) Assignee: ÉCOLE POLYTECHNIQUE FÉDÉRALE DE LAUSANNE (EPFL), Lausanne (CH)

( * ) Notice: Subject to any disclaimer, the term of this patent is extended or adjusted under 35 U.S.C. 154(b) by 289 days.

(21) Appl. No.: 15/323,645

(22) PCT Filed: Jun. 11, 2015

(86) PCT No.: PCT/EP2015/063005
§ 371 (c)(1),
(2) Date: Jan. 3, 2017

(87) PCT Pub. No.: WO2016/000926
PCT Pub. Date: Jan. 7, 2016

(65) Prior Publication Data
US 2017/0139204 A1  May 18, 2017

(30) Foreign Application Priority Data
Jul. 2, 2014 (EP) .................................. 14175447

(51) Int. Cl.
*G02B 27/00* (2006.01)
*G02B 27/09* (2006.01)
(Continued)

(52) U.S. Cl.
CPC ..... *G02B 27/0012* (2013.01); *G01N 21/4133* (2013.01); *G02B 3/0043* (2013.01); *G02B 27/0927* (2013.01); *G06F 30/17* (2020.01)

(58) Field of Classification Search
None
See application file for complete search history.

(56) References Cited

U.S. PATENT DOCUMENTS

| 7,009,789 B1 * | 3/2006 | Brown ...................... G02B 5/00 359/613 |
| 2013/0066596 A1 * | 3/2013 | Papas .................. G02B 27/0012 703/1 |

FOREIGN PATENT DOCUMENTS

| DE | 10108637 A1 | 9/2001 |
| EP | 2711745 A2 | 3/2014 |
| WO | WO 2006/058885 A1 | 6/2006 |

OTHER PUBLICATIONS

Novak et al. "Virtual Ray Lights for Rendering Scenes with Participating Media", ACM Trans. Graph. 31 4, Article 60 (Jul. 2012), 11 pages. (Year: 2012).*

(Continued)

*Primary Examiner* — Suzanne Lo
(74) *Attorney, Agent, or Firm* — Saliwanchik, Lloyd & Eisenschenk

(57) ABSTRACT

Method of designing a refractive surface, comprising providing a refractive object having a refractive surface with an initial geometry, determining a refraction of incident illumination through the refractive surface with the initial geometry to create a source irradiance $E_S$ distribution on a receiver; and determining a shape of the refractive surface of the refractive object such that a resulting irradiance distribution on the receiver matches a desired target irradiance $E_T$ provided by a user.

17 Claims, 9 Drawing Sheets

(51) Int. Cl.
G02B 3/00 (2006.01)
G06F 30/17 (2020.01)
G01N 21/41 (2006.01)

(56) References Cited

OTHER PUBLICATIONS

Kiser et al. "Caustic Art" EPFL Technical Report, Jun. 2012, 10 pages. (Year: 2012).*
Kiser et al. "Architectural Caustics—Controlling Light with Geometry", 2013 Advances in Architectural Geometry 2012, pp. 91-106. (Year: 2013).*
Liktor et al. "Real-Time Volume Caustics with Adaptive Beam Tracing" ACM 2011, pp. 47-54. (Year: 2011).*
Walter, et al. "Single Scattering in Refractive Media with Triangle Mesh Boundaries", ACM SIGGRAPH 2009, 7 pages. (Year: 2009).*
Yu et al. "Image-space Caustics and Curvatures", Oct. 2007, 9 pages. (Year: 2007).*
International Search Report issued by the European Patent Office for International Application No. PCT/EP2015/063005.
European Communication in European Application No. 14175447.3.
Oliker, Vladimir et al. (Jan. 1, 2013) "Ray mapping and illumination control" *Journal of Photonics for Energy* 3(1):35599 (Society of Photo-optical Instrumentation Engineers).

\* cited by examiner source  target  simulation  analytic solution
|— 100 mm —|

Error vs. OTM resolution for source mesh of 80,957 vertices

| #samples | 45 | 208 | 1,042 | 11,996 | 82,369 |
| --- | --- | --- | --- | --- | --- |
| max. error | 6.1912 | 2.1206 | 0.8753 | 0.4636 | 0.3928 |
| avg. error | 1.1660 | 0.1902 | 0.1588 | 0.1666 | 0.1130 |

Error vs. source mesh resolution using analytic normals

| vertices | 5,152 | 20,348 | 80,957 | 322,899 | 1,289,432 |
| --- | --- | --- | --- | --- | --- |
| max. error | 1.5545 | 0.7513 | 0.3928 | 0.2064 | 0.1251 |
| avg. error | 0.3777 | 0.1909 | 0.1003 | 0.0795 | 0.0771 |

Linear blend of Voronoi diagram to power diagram for 208 samples initial Voronoi diagram  ⟶  final power diagram

REFRACTIVE SURFACE

CROSS-REFERENCE TO RELATED APPLICATIONS

This application is the U.S. national stage application of International Patent Application No. PCT/EP2015/063005, filed Jun. 11, 2015, which claims the benefit of European Patent Application No. 14175447.3, filed Jul. 2, 2014, the disclosures of which are incorporated by reference herein in their entirety, including any figures, tables, or drawings.

The invention refers to the designing of a refractive surface. In particular, the invention refers to a method of inverse caustic design.

The interplay of light and form is fundamental for how the world is perceived. Reflective or refractive objects exhibit particularly rich interactions with light, often creating fascinating caustic effects. Manually controlling the appearance of caustics is notoriously difficult, as slight changes to a specular surface can have large, non-local effects on the created caustic image. Objects such as the one shown in FIG. 1 are virtually impossible to create with traditional means of shaping or sculpting a refractive material.

This inverse light transport problem is addressed in recent publications including [Finckh et al. 2010], [Papas et al. 2011], [Kiser et al. 2012] and [Yue et al. to appear].

For a broader overview addressing this technical field it is referred to the survey of Patow and Pueyo [2005] that provides an extensive discussion of methods for inverse surface design based on a desired light transport behavior. An interesting related survey focusing on computational tools to design and fabricate material appearance has been presented by Hullin et al. [2013]. One of the first methods in computer graphics to approach the caustic design problem is the work of Finck and colleagues [2010]. They use an analysis-by-synthesis strategy that stochastically perturbs a given input surface to better match the desired caustic image. While interesting results can be achieved with this approach, the optimization, even with an efficient GPU implementation, incurs a high computational cost and can be prone to local minima leading to undesirable artifacts in the generated image.

Recently, there have been a number of papers related to this field that apply a more direct optimization approach. These can be divided into discrete patch-based approaches, and continuous parameterization based methods. Weyrich et al. [2009] generate a set of sloped, planar microfacets to realize a desired distribution of given ray directions. These microfactes are arranged in a regular grid using simulated annealing to minimize discontinuities. This approach is not designed to reproduce smooth distributions and does not scale well to high resolutions, which limits its applicability for caustic design. Papas et al. [2011] extend the microfacet approach to curved micropatches, which produce specks of light with an anisotropic Gaussian distribution. While significantly improving the quality of the caustic images, this method retains some of the discretization artifacts and has difficulties in resolving low intensity regions. Yue et al. [2012] propose a different optimization approach using re-configurable prismatic sticks that refract parallel light onto a screen. Their focus is on creative applications where several discrete images can be generated with a single set of refractive sticks. Beyond the limited resolution and other visual deficiencies, a main difficulty with these discrete approaches is that they need to solve a complex spatial arrangement problem. These typically lead to a NP-hard optimizations that require approximation solvers.

Yue et al. [to appear] and Kiser et al. [2012] address this problem by formulating a continuous optimization. Their solutions can produce smooth surfaces that lead to a significant improvement in the quality of the caustic images. The core idea is to find a continuous bijective mapping between incoming light and caustic image through a 2D parameterization that locally adapts area to match the desired target brightness. However, enforcing smoothness globally and requiring a one-to-one mapping is unnecessarily restrictive and thus limits the type of caustic images that can be produced. High-contrast regions, intense concentrations of light, or completely black areas are very difficult to achieve this way, as they lead to large deformations of the underlying geometry.

Gilmm and Oliker [2003] investigated inverse reflector design for far-field distributions, where only the direction of reflected ray is considered. They showed that certain far-field reflectors can be modeled by a 2nd order nonlinear elliptic PDE of Monge-Ampere type, which can be solved in variational form using Monge-Kantorovich mass transfer.

It is the object of the present invention to provide a method for designing a refractive surface that avoids the shortcomings of prior art and enables a broader range of target light distributions. Furthermore, it is an object to allow an easy fabrication of an object comprising such a refractive surface.

This object is achieved with a method having the features of claim 1.

Embodiments of the invention are described in the dependent claims.

The method according to the invention comprises providing a refractive object having a refractive surface with an initial geometry; determining a refraction of incident illumination through the refractive surface with the initial geometry to create a source irradiance $E_S$ distribution on a receiver; and determining a shape of the refractive surface of the refractive object such that a resulting irradiance distribution on the receiver matches a desired target irradiance $E_T$ provided by a user.

As a preparation, the initial geometry of the refractive object, the caustic generator, and the incident illumination on that object are determined. The position and orientation of a receiver screen on which the desired caustic image should appear can be specified as well. The receiver screen can be a diffuse planar surface of arbitrary orientation (e.g. vertical or inclined).

The initial refractive object can be a concave or convex slab of transparent material having essentially smooth and parallel surfaces. Furthermore, a number of assumptions can be made. For example, the assumption of a geometric model of optics with perfect specular scattering can be made. Furthermore, light rays can be assumed to arrive at each point of the source surface from a single direction only, which requires idealized illumination such as parallel light or light emitted by point sources.

The method of the invention enables high-contrast target images including completely black areas, point and curve singularities of infinite light density in the target image, as well as non-uniform input light distributions with free boundaries on non-planar base geometries.

The invention provides a method that permits to produce piecewise smooth surfaces of the transparent object and non-bijective mappings, which eliminates a number of shortcomings of previous methods. This leads to a significantly richer space of caustic images, including smooth transitions, singularities of infinite light density, and completely black areas. As a result an easier fabrication of a refractive object is enabled.

The invention significantly expands the creative possibilities of computational caustic design and enables caustic lighting for a variety of application domains, such interior and product design, lighting, architecture, or art.

The same principles apply to a reflective surface instead of a refractive surface. Hence, a reflective object comprising a reflective surface could be generated and used instead of a refractive object.

According to an embodiment an algorithm can be used for solving equations describing the problem for the shape of a transparent object including the refractive surface such that the refracted light paints a desired caustic image corresponding to the target irradiance $E_T$ on a receiver screen.

According to a further embodiment the determining a refraction of incident illumination through the refractive surface with the initial geometry to create the source irradiance $E_S$ distribution on the receiver includes tracing of rays of the incident illumination through the refractive surface of the refractive object with the initial geometry. The tracing of rays can be performed according the physical laws of refraction and reflection such as Snell's law. The tracing of several rays representing an entire light distribution incident on the refractive surface is performed in the same way.

According to another embodiment the method includes changing the shape of the refractive surface of the refractive object to obtain an optimized target surface including determining an optimal transport map (OTM) from a source irradiance $E_S$ distribution to a target irradiance $E_T$ distribution on the receiver, the map encoding how the irradiance distribution of light on the receiver needs to be modified to obtain the desired target image.

According to yet another embodiment the method further includes determining a target position $x_R$ on the receiver for each light ray that leaves the refractive surface of the refractive object such that the overall irradiance distribution closely matches the target irradiance $E_T$, determining normals on the refractive surface of the refractive object using Snell's law, and integrating the normals to obtain the optimized target surface.

According to a further embodiment the method further includes representing incident illumination on the refractive surface of the refractive object as a triangle mesh on the refractive surface, where each vertex comprises an incoming direction and an intensity value of a ray; tracing of the rays through the refractive surface at the vertices of the mesh onto the receiver to obtain a piecewise linear representation of the source irradiance $E_S$ on the receiver, wherein each site $s_i$ of a set S of sites on the receiver approximately represents the same amount of flux; discretizing a domain U including the set S of sites of the triangle mesh comprising generating a Voronoi diagram of S; and determining how each Voronoi cell $C_i$ of the Voronoi diagram needs to be deformed and moved such that its flux $\Phi_i$ is distributed to match the desired target distribution $E_T$. A Voronoi cell is a region of a number of regions into which a Voronoi diagram is divided, wherein the regions are defined by a set of points (called seeds, sites, or generators) which is specified beforehand and wherein for each seed there will be a corresponding region consisting of all points closer to that seed than to any other.

The optimal transport formulation indicated above in combination with an adaptive Voronoi discretization scheme enables a significantly broader range of target light distributions than previous methods. Instead of a triangle mesh any other suitable mesh geometry can be used, including, for example, a square or another polygonal mesh.

According to still another embodiment the method includes representing the target irradiance distribution $E_T$ as a power diagram of the sites S by determining weights w, of the power diagram that best match the target irradiance distribution $E_T$.

According to yet another embodiment the weights are determined by the function:

$$f(\omega) = \sum_{s_i \in S} \left( \omega_i \mu_S(C_i^0) - \int_{C_i^\omega} (\|x - s_i\|^2 - \omega_i) \, d\mu_T(x) \right)$$

wherein $\mu_S$ and $\mu_T$ are defined as $$\mu_S(\Omega) := \frac{\Phi_S(\Omega)}{\Phi_S(U)}, \mu_T(\Omega) := \frac{\Phi_T(\Omega)}{\Phi_T(U)},$$

According to an embodiment determining the shape of the refractive surface of the refractive object includes: a.) discretizing the surface of the refractive object with a triangle mesh that is initialized on the refractive surface of the refractive object with the initial geometry; b.) determining normals on the surface of the refractive object for each vertex of the mesh using Snell's law from the target positions $x_R$ on the receiver for each light ray as derived from the OTM; c.) moving the vertices to best match the target surface normal, while respecting the flux densities $\Phi$; d.) iterating b.) and c.); and e.) integrating the normals on the surface of the refractive object.

According to yet another embodiment the target position $x_R$ where a ray impinges on the receiver is derived from the OTM by natural neighbor interpolation of the OTM on the source mesh.

According to a further embodiment moving the vertices to best match the target surface normals comprises minimizing the compound energy defined by $\arg_x \min w \cdot [E_{int}, E_{dir}, E_{flux}, E_{reg}, E_{bar}]$, where w is a weighting factor and the integration energy $E_{int}$ aligns the vertex normal ñ of $M_T$ with the target normals n derived from the OTM:

$$E_{int} = \sum_{v \in M_T} \|n - \tilde{n}\|_2^2,$$

where n is determined by averaging the normal of incident triangles weighted by the incident angles. It is to be noted that the above formula includes any suitable recombination of the respective energies. For example, it is possible that the weight of one of the energies is zero. Furthermore, the formula may comprise additional or other regularization energies than those presently indicated.

According to yet another embodiment respecting the flux densities $\Phi$ comprises maintaining the flux over a cell of the mesh $M_T$ constant or significantly constant.

According to a further embodiment the method further comprises introducing discontinuities in the field of normals on the surface of the refractive object at optimally chosen locations. The introduction of discontinuities in the field of normals supports the generation of completely black regions in a target image obtained with light shined on a refractive or reflective surface produced according to embodiments of the invention.

According to yet another embodiment the method further comprises the inclusion of at least one of one or more point singularities and curve singularities of infinite light density in the target flux distribution $\Phi_T$, represented as $$\Phi_T(\Omega) = \sum_{i=1}^{N_\delta} \Phi_0^i(\Omega) + \sum_{j=1}^{N_\gamma} \Phi_1^j(\Omega) + \Phi_2(\Omega). \quad (1)$$

wherein flux and irradiance are related as $\Phi(\Omega) = \int_\Omega E(x,y) dx dy$ for any subset $\Omega \subseteq IR^2$, including functions $\Phi_0$, $\Phi_1$, and $\Phi_2$ for point singularities, curve singularities, and area distributions, respectively, wherein a point singularity $\delta$ is specified by a position $x_\delta \in U$ and a flux $\Phi_\delta$ such that $$\Phi_0(\Omega) = \begin{cases} \Phi_\delta & \text{if } x_\delta \in \Omega \\ 0 & \text{otherwise} \end{cases}.$$

wherein a curve singularity is represented by a curve $c:[0;L] \to IR^2$ and a curve density function $f:[0, L] \to IR$, where c is parameterized with respect to arc length and L is the total length of c such that $\Phi_1(\Omega) = \int_0^L f_\Omega(t) dt,$ where is $f_\Omega$ the restriction of f onto $\Omega$:

$$f_\Omega = \begin{cases} f(t) & \text{if } c(t) \in \Omega \\ 0 & \text{otherwise} \end{cases}.$$

and $$\Phi_2(\Omega) = \int_\Omega E(x, y) dx dy,$$

where $E: U \to IR$ is an integrable 2D irradiance function.

The inclusion of one or more point singularities and/or curve singularities permits the generation of very bright lines, points or areas or high light intensities that are modeled as infinite light densities in the target image.

According to the invention an object is provided that comprises at least one refractive or reflective surface that is designed according to the method as described above. In particular, the refractive or reflective surface which is obtained as a result of the method is transferred to the surface of a transparent piece or slab using a milling machine. However, the refractive or reflective surface can also be prepared using other processes such as etching, polishing, etc.

According to one embodiment the object is configured such that it can be illuminated with a point light source or a homogeneous light source emitting collimated light. The use of numerous different illumination sources is possible including the natural sunlight, light sources emitting collimated light or point light sources. Preferably, the object is optimized for wavelengths of the visual spectrum. However, objects designed for other wavelengths such as in the IR or UV spectrum may be conceived as well.

Furthermore, the object can be provided by a slab with a refractive or reflective surface that can be produced with one or more of numerous materials including acrylic, glass, metal etc. The slab and its reflective or refractive surface may have a square shape or a freeform shape. In a view from the top, the slab may have a rectangular, in particular, square shape or a circular shape, wherein the reflective or refractive surface is provided at least on one of the front and back surfaces. The slab may also have a generally concave lens-shape with substantially parallel surfaces. The index of refraction of the material may be in a range between 1.00 and 2.00.

According to one embodiment an antireflective coating is provided on at least one of the surfaces of the object.

Furthermore, a computer program is provided, comprising instructions that carry out the method of the invention when the program is run on a computer.

According to the invention several possible uses are provided. In particular, an object produced by the method of the invention or any embodiment thereof can, for example, be used as a part of a watch such as a wrist watch, such as for example a light reflecting or refracting watch glass or a part thereof, a light reflecting or refracting case or back of the watch or dial or a part thereof.

According to another use, an object produced by the method can be used for example as a refractive glass window of a room or shop or a part thereof projecting sunlight or artificial light into the room or shop or on a wall or floor of the room or shop, can be used as a reflective or refractive shop window or a part thereof that creates an image on the sidewalk when light is shined on the window from the inside or outside, and refracted or reflected thereby, respectively. Furthermore, an object produced by the method can be used as a reflective or refractive metallic or transparent facade element or a part thereof, such as for example a reflective or refractive metallic or transparent facade element with actuators to dynamically modify the shape of the facade.

According to another embodiment an object produced by the method can be used for example as a reflective car body or a part thereof creating an image on the road by reflecting the sun.

According to a further embodiment an object produced by the method can be used for example for an interior design object or a part thereof such as for example as a glass/acrylic table creating an image on the floor by light from a lamp at the ceiling, or as a lamp shade reflecting or refracting light.

According to yet another embodiment an object produced by the method can be used for example as a part of a consumer product such as a reflective or refractive back case of a phone or a portable computer.

According to still another embodiment an object produced by the method can be used for example as an optic component such as an optic component for beam shaping of a laser or light beam, as a reflector or a beam shaping glass of a lamp such as, for example, a car headlamp, or as a refractive or reflective lens to transfer one light distribution into another light distribution, e.g. to transfer an impinging non-uniform light distribution into a uniform light distribution after reflection or refraction by an object produced by the method.

Additional features, benefits and details of the invention will result from the following detailed description with regard to the accompanying drawing in which FIG. 1 shows an acrylic slab with a 3D surface that refracts uniform light to focus on sharp intensity lines that sketch a human brain, wherein the photographs of the brain illustrate how a caustic image evolves as the acrylic slab is rotated into position;

FIG. 2 schematically shows a processing pipeline for forming a refractive surface including (i.) determining an initial source irradiance distribution on a receiver screen from incident illumination, (ii.) finding a mapping to a target distribution from which target normals on the source surface are obtained, and (iii.) obtaining the surface that best matches these normal in an optimization process;

FIG. 3 shows caustic images obtained with transparent objects designed with a Poisson-based continuous (PBC) method of [Yue et al.] including an algorithm that needs to artificially reduce contrast to match the shape of the logo and a caustic image with very high quality produced with a transparent object according to the present method;

FIG. 4 schematically shows how a source irradiance distribution is sampled using Lloyd sampling to obtain an initial Voronoi diagram, wherein each Voronoi cell approximately receives the same irradiance, and an optimized power diagram obtained with an optimization which includes determining the weights of the power diagram that best matches the target distribution, wherein the dots show the centers of mass of the source and target distribution, respectively, integrated over the cells;

FIG. 5 shows the integration of the target measure on a power cell, wherein curve singularities are approximated by piecewise linear segments;

FIG. 6 shows a two-stage target optimization, wherein the target normal ñ for each vertex (left) has been determined in a first stage, then the vertex position x has been determined in a second stage to obtain the target surface that matches these normals (right); and both stages are subsequently iterated because x changes and hence the target direction $d_T$ and consequently the normal ñ need to be updated;

FIG. 7 shows a natural neighbor interpolation of the OTM onto the vertices of a source mesh, wherein $\tilde{x}_R$ has been obtained as the intersection with the receiver plane of the ray leaving the source surface at $x_S$ in direction $d_S$, an insertion of this point into the Voronoi diagram of the source distribution yields the blue cell, and the fraction of area of each original Voronoi cell that the blue cell covers defines the interpolation weights for determining the target position $x_R$ from the corresponding centroids of the target power diagram (right);

FIG. 8 shows at the left side the benefit of 3D integration in the present optimal transport algorithm integrated on a regular height field as compared to previous methods [Kiser et al. 2012, Yue et al. to appear]; since the grid cannot align with the sharp creases produced by discontinuities in the OTM, artifacts appear at high contrast transitions, while the present full 3D integration scheme largely avoids these artifacts by properly aligning mesh edges to the creases;

In the following an exemplifying embodiment will is described with reference to the figures.

Figure 2:
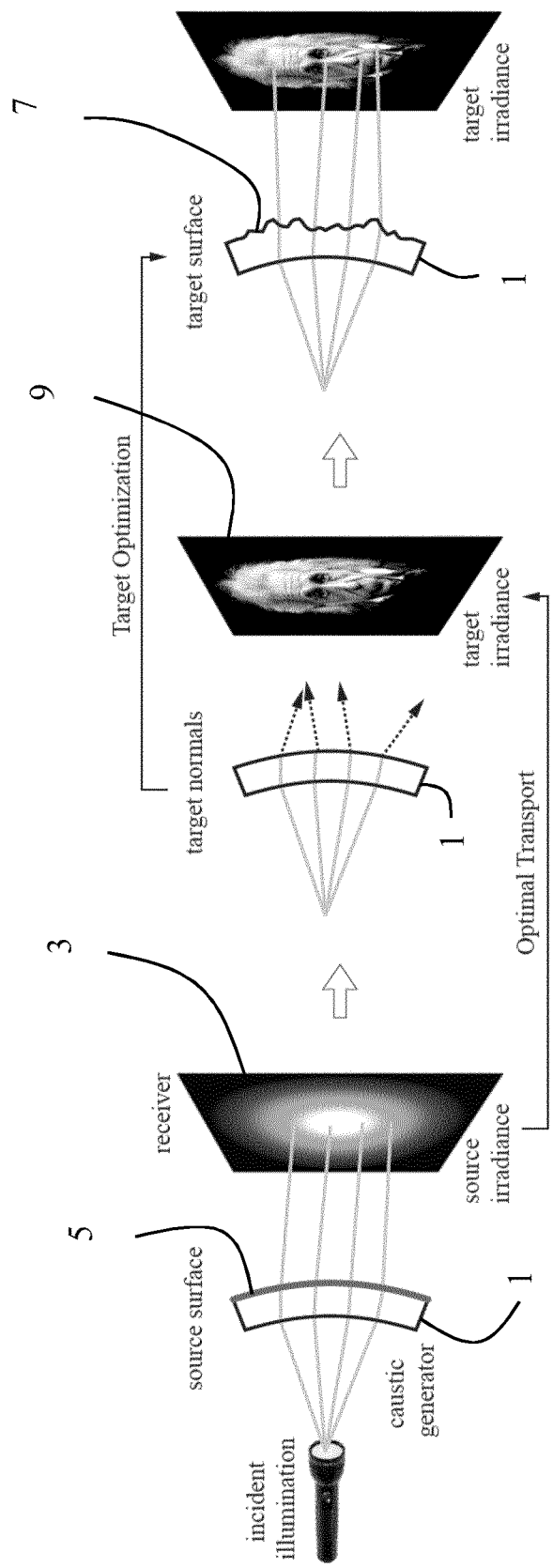

Using the present method for designing a refractive surface of a transparent object or slab, the initial geometry of the refractive object, i.e. the caustic generator 1, and the incident illumination on that object are determined first. As shown in FIG. 2, the initial geometry of the refractive object 1 can be determined as a bend slab of transparent material having smooth parallel surfaces 5. In addition, the position and orientation of a receiver 3 on which the desired caustic image should appear are specified. The receiver is typically a diffuse planar surface of arbitrary (e.g. vertical or inclined) orientation. The incident illumination is refracted through the initial geometry to create an irradiance distribution on the receiver 3 that is called the source irradiance $E_S$. It is the goal to determine the shape of the caustic generator 1 such that the resulting irradiance distribution on the receiver 3 matches a desired target irradiance $E_T$ provided by a user. To formulate the optimization several simplifying assumptions are made. A geometric model of optics with perfect specular scattering is used. To create the desired caustic image, only a single scattering event for each light path is modified, i.e. the shape of a single refractive surface that is called the source surface 5 is changed. The optimized surface computed by an algorithm is the target surface 7. Further it is assumed that light rays arrive at each point of the source surface 5 from a single direction only. This requires idealized illumination such as parallel light or light emitted by point sources. The used algorithm first calculates the source irradiance $E_S$ by tracing rays of the incident illumination through the source geometry. Then an optimal transport map (OTM) from source to target on the receiver 3 screen is determined. This map encodes how the distribution of light needs to be modified to obtain the desired target image. More specifically, a target position on the receiver for each light ray that leaves the source surface 5 is computed. Using Snell's law then appropriate normals 9 on the source surface are determined that can be integrated to obtain the optimized target surface 7.

Below it is first described how the target distribution is defined. Subsequently, the core components of the algorithm are described. Then it will be explained how to compute an OTM using an optimization on a power diagram. Furthermore, an iterative optimization algorithm is described to compute the 3D surface of the caustic generator 1 from the OTM.

An optimal transport formulation has been used to map the source irradiance $E_S$ to the target $E_T$ in order to compute the target positions on the receiver 3 for each refracted light ray. In this setup, source and target are more conveniently represented as radiant flux measures $\Phi_S$ and $\Phi_T$, respectively. A measure is a function that assigns a non-negative real number to subsets of a domain, satisfying certain properties such as non-negativity and countable additivity [Bogachev 2006].

Flux $\Phi$ and irradiance E are related as $\Phi(\Omega)=\int_\Omega E(x,y) dxdy$ for any subset $\Omega \subseteq IR^2$. Let U be the union of the supports of $\Phi_S$ and $\Phi_T$ on the receiver, i.e. the smallest closed set such that $\Phi_S(IR^2\setminus U)=\Phi_T(IR^2\setminus U)=0$. In the following, the subscript for a radiant flux that can refer to either $\Phi_S$ and $\Phi_T$ is dropped.

Singularities

One of the most fascinating features of caustics is the intense concentration of brightness when light is sharply focused onto points or curves. To capture this effect point and curve singularities of infinite light density are supported in the target distribution $\Phi_T$. These can be represented using point and line Dirac delta distributions [Zhang and Zheng 2012]. Three types of base functions $\Phi_0$, $\Phi_1$, and $\Phi_2$ are defined for point singularities, curve singularities, and area distributions, respectively. These base functions can then be combined arbitrarily to build the desired target distribution $\Phi_T$. A point singularity $\delta$ is specified by a position $x_\delta \in U$ and a flux $\Phi_\delta$, such that $$\Phi_0(\Omega) = \begin{cases} \Phi_\delta & \text{if } x_\delta \in \Omega \\ 0 & \text{otherwise} \end{cases}.$$

A curve singularity is represented by a curve $c:[0, L] \to IR^2$ and a curve density function $f:[0, L] \to IR$, where c is parameterized with respect to arc length and L is the total length of c. Then $\Phi_1$ is defined as $$\Phi_1(\Omega) = \int_0^L f_\Omega(t) dt,$$

where is $f_\Omega$ the restriction of f onto $\Omega$:

$$f_\Omega = \begin{cases} f(t) & \text{if } c(t) \in \Omega \\ 0 & \text{otherwise.} \end{cases}$$

Finally, $$\Phi_2(\Omega) = \int_\Omega E(x,y) dx dy,$$

is defined, where $E:U \to IR$ is an integrable 2D irradiance function.

Target

Let $\{\delta_1, \ldots, \delta_{N\delta}\}$ be a set of $N_\delta$ point singularities and $\{\gamma_1, \ldots, \gamma_{N\gamma}\}$ be a set of $N_\gamma$ curve singularities. The target flux function $\Phi_T$ is then represented by the combination of 0, 1, and 2-dimensional integral functions as $$\Phi_T(\Omega) = \sum_{i=1}^{N_\delta} \Phi_0^i(\Omega) + \sum_{j=1}^{N_\gamma} \Phi_1^j(\Omega) + \Phi_2(\Omega). \quad (1)$$

Curve singularities are modeled with piecewise linear representations. Unlike previous work, these singularities allow infinite light density. To represent the 2D irradiance function E a pixel grid of intensity values or a vector representation is supported. Note that both the source and the target distributions can contain regions of zero intensity anywhere in U. In particular for the target, completely black regions are not possible in previous methods that use continuous generator surfaces.

Optimal Transport

The goal of computational caustic design is to redirect light rays such that the desired target light image is drawn on the receiver screen. Since a mostly diffuse receiver is assumed that scatters light equally in all directions, the perception of the caustic image depends mainly on the flux density or irradiance at each point, but is largely independent of the direction of the incoming rays hitting the screen. This means that the optimization on the target positions of each light ray on the receiver can be formulated. In other words, the question needs to be answered of how the initial source positions of each ray on the receiver have to be moved towards new target positions such that the overall irradiance distribution matches the target $E_T$ as closely as possible. This problem is solved using an optimal transport formulation to compute the target positions.

Optimal transport is ideally suited to handle discontinuities and singularities, while maximizing smoothness to obtain high caustic image quality.

Continuous Optimal Transport

The basic concepts of optimal transport that are most relevant for the present approach are briefly discussed. For an extensive review it is referred to [Villani 2009]. Optimal transport is concerned with finding a mapping between two probability measures, a source measure $\Phi_S$ and a target measure $\Phi_T$. A 2D transport map from $\mu_S$ to $\mu_T$ is a function $\pi: U \to U$ for some domain $U \subseteq IR^2$, such that $\mu_S(\Omega) = \mu_T(\pi(\Omega))$ for every subset $\Omega \subseteq U$. A global transport cost for $\pi$ can be defined as $$c(\pi) = \int_U \|x - \pi(x)\|^2 d\mu_S(x).$$

For this $l_2$ cost measure it has been shown that a unique optimal transport map (OTM) exists that is a global minimizer of the total transport cost [Villani 2009]. Minimizing the transport cost in the present context means that overall the directions of the refracted light rays are modified as little as possible. This minimizes the change in curvature of the target surface and ensures that no foldovers are introduced in the mapping. Among other benefits, this simplifies physical fabrication and helps to avoid optical deficiencies such as internal reflections.

To apply the optimal transport formalism to the present problem, it is necessary to transform radiant flux measures $\Phi_S$ and $\Phi_T$ into probability measures, i.e. measures of total mass of one. This can be achieved as $$\mu_S(\Omega) := \frac{\Phi_S(\Omega)}{\Phi_S(U)}, \mu_T(\Omega) := \frac{\Phi_T(\Omega)}{\Phi_T(U)}, \quad (2)$$

where $\Phi_S(U) = \Phi_T(U)$ is the total mass of $\Phi$, assuming that no light is lost due to absorption.

Discrete Optimal Transport

The computation of the discrete OTM follows the algorithm introduced by Aurenhammer et al. [1998] and later extended and improved by Merigot [2011]. A similar approach has been proposed by de Goes et al. [2012].

It is assumed that the incident illumination is represented as a triangle mesh on the source surface, where each vertex carries an incoming direction and an intensity value. This triangle mesh is raytraced through the source surface onto the receiver screen to obtain a piecewise linear representation of the source irradiance $E_S$. Here it is assumed that the refraction through the source surface does not create any fold-overs or singularities. $E_S$ is resampled such that each sample roughly represents the same amount of flux to best exploit the degrees of freedom in the OTM optimization. For this purpose, Lloyd sampling is applied on $E_S$ to obtain a set $S = \{s_1, \ldots, s_n\}$ of sites $s_i \in U$. The domain U is then discretized using a Voronoi diagram of S. The goal is to determine how each Voronoi cells need to be deformed and moved, such that its flux is distributed to match the desired target distribution. This can be achieved by representing the target distribution as a power diagram (weighted Voronoi diagram) on the sites S and finding suitable weights (see FIG. 4).

Let $P_\omega$ be the power diagram of S with a set of weights $\omega = \{\omega_1, \ldots, \omega_n\}$. When all weights $\omega_i$ are zero, the power diagram coincides with the Voronoi diagram, which is denoted as $P_0$.

Let $C_i^\omega$ be the power cell of $P_\omega$ associated with site $s_i$. Aurenhammer and colleagues [1998] have shown that there is a unique assignment of weights such that $\mu_S(C_i^0)=\mu_T(C_i^\omega)$ for all i. Recalling the definitions of Equations 1 and 2, this means that for a suitable set of weights w, light refracted by the initial base geometry onto the Voronoi cell $C_i^0$ on the receiver will be redirected to the power cell $C_i^\omega$ of $P_\omega$. The ratio of areas of $C_i^0$ and $C_i^\omega$ accounts for the relative difference of intensity in the source and target.

Merigot [2011] showed that the unknown weight vector $\omega$ can be found as a global minimizer of the convex function $$f(\omega) = \sum_{s_i \in S}\left(\omega_i \mu_S(C_i^0) - \int_{C_i^\omega}(\|x-s_i\|^2 - \omega_i)d\mu_T(x)\right). \quad (3)$$

This result is fundamental for the algorithm as it ensures that the OTM can be found by a suitable gradient descent scheme. It turns out that the corresponding gradients are simply the differences of the integrated source and target densities, i.e.

$$\frac{\partial f}{\partial \omega_i} = \mu_S(C_i^0) - \mu_T(C_i^\omega). \quad (4)$$

An L-BFGS solver [Liu and Nocedal 1989] is used to minimize the objective function f of Equation 3, following the multi-scale strategy proposed in [Merigot 2011]. It is referred to this paper for detailed derivations and implementation details. In all examples the number of points is scaled by a factor of four between two different levels of the multi-scale solver. The CGAL library [Yvinec 2013] with exact arithmetic is used to compute the power diagrams.

Singularities

Figure 5:
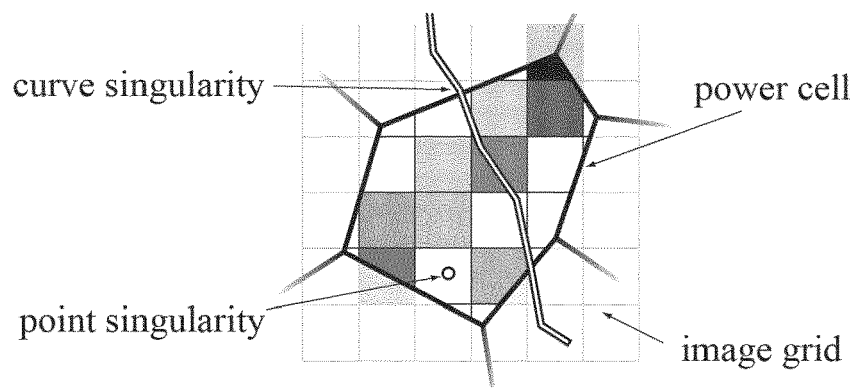

Merigot's solution maps a source density to a finite set of point sites. Presently, an inverse formulation is used, i.e. a set of sites, the samples on the source distribution, is mapped to the density defined by the target measure. This makes it possible to naturally integrate singularities in the target measure by adapting the calculations of the integrals in Equations 3 and 4 (see FIG. 5). The integrals are split over the target measure on each power cell into separate terms according to Equation 1 and each term is evaluated separately. Point singularities are trivial to evaluate. For curve singularities, each curve is approximated by a polygon segment and the corresponding density is approximated by a piecewise linear function defined over the polygon, leading to a simple analytical formula for the integration. To evaluate integrals over pixel areas and similarly for filled polygons, the intersection of each pixel with the cell is computed first to adapt the pixel boundaries appropriately. A constant density for each pixel area is assumed and Green's theorem is applied to transform the area integral into a simpler boundary integral. A benefit of the present optimal transport formulation compared to previous methods [Kiser et al. 2012; Yue et al. to appear] is that the OTM is not required to be bijective. This means, for example, that light going through a certain area of the generator can be focused onto a single point or curve, thus creating singularities of infinite light density.

Discontinuities

The regularity of optimal transport has been studied extensively (see [Philippis and Figalli 2013] for a recent survey). Essentially, OTMs are continuous for a quadratic cost function like the one that is presently used, if the probability measures are sufficiently regular and the target convex. Nevertheless, discontinuities arise naturally in optimal transport for non-convex or high-contrast targets (see [Chodosh et al. 2013] for a sufficient condition for discontinuity in planar OTMs). Adjacent regions in the source can be mapped to distant regions on the target, which leads to discontinuities in the normals of the target surface. These discontinuities are in fact necessary when aiming at completely black interior regions, for example (see FIG. 10). This additional flexibility to introduce discontinuities in the mapping is a major benefit of optimal transport, as it strongly reduces distortion artifacts commonly observed in globally smooth methods such as [Kiser et al. 2012; Yue et al. to appear] (see also FIGS. 13 and 3).

Target Optimization

Figure 6:
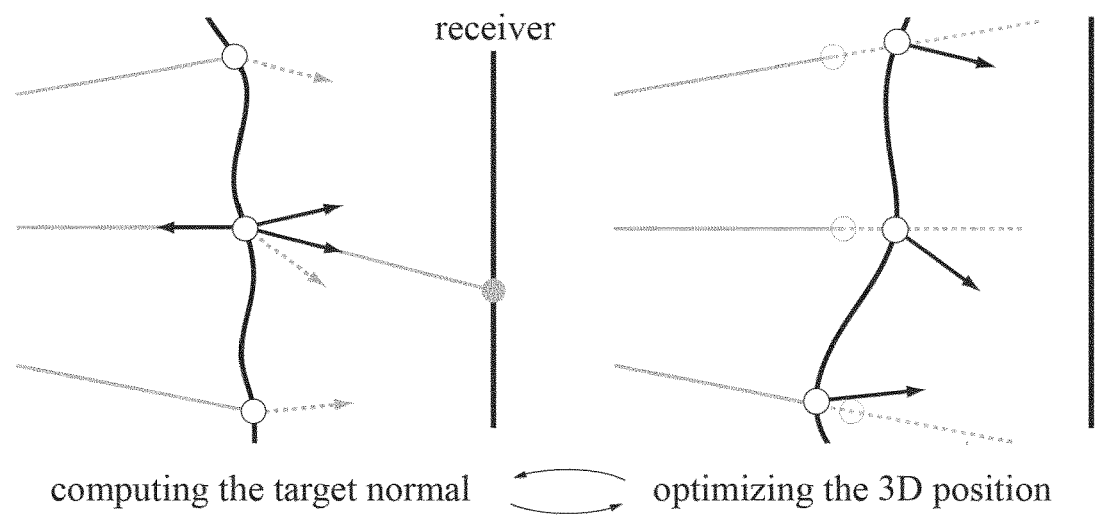

The OTM provides us with a discrete mapping between source and target irradiance distributions. More precisely, it provides the positions where rays leaving the source surface should intersect the receiver. The goal of the target optimization is now to find the corresponding target surface that refracts the rays towards these target positions. For this purpose the target surface is discretized with a triangle mesh that is initialized on the source surface. Target normals are computed for each vertex, using Snell's law, from the target ray directions derived from the OTM. The optimization then moves the vertices to best match these normals while respecting the desired flux densities. Since modifying the vertex positions changes the target directions, this process is iterated (see FIG. 6).

OTM Interpolation

Figure 4:
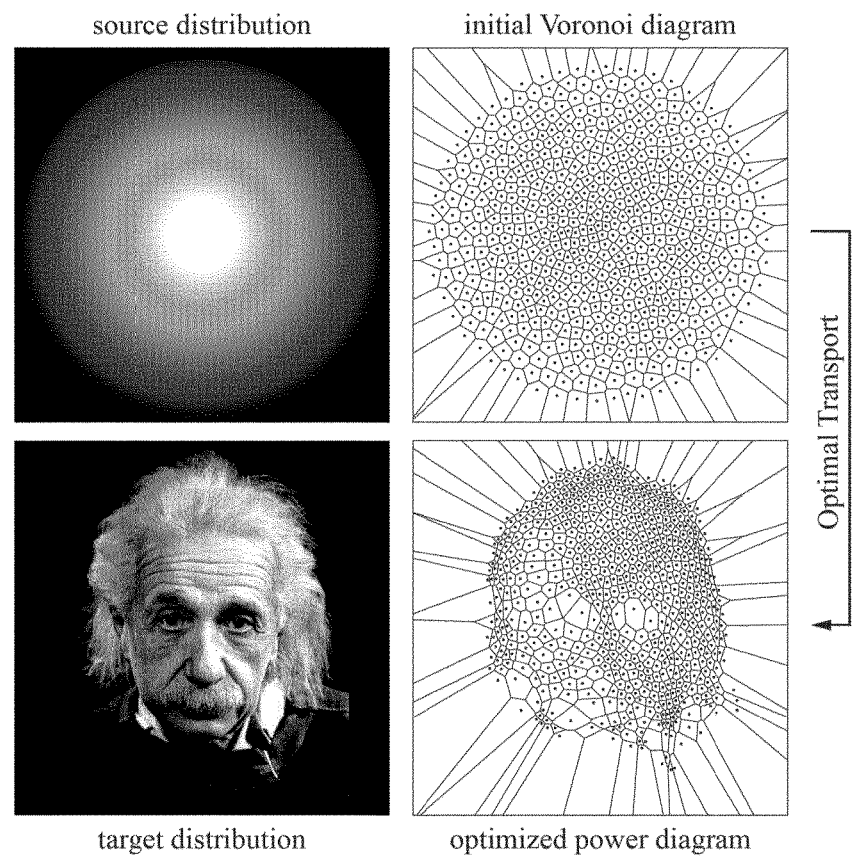
Figure 7:
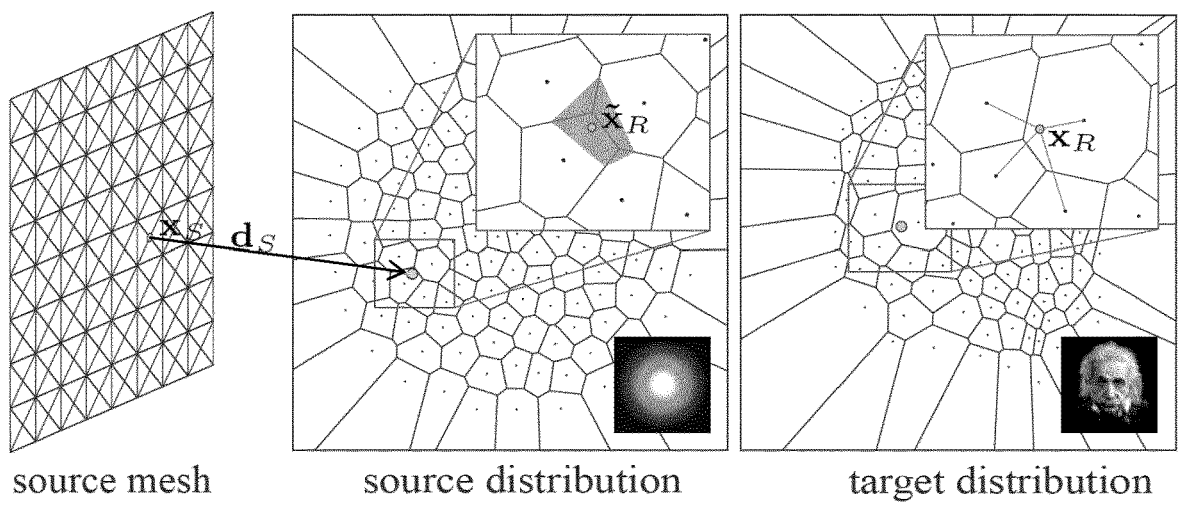

As illustrated in FIG. 4, the power diagram adapts to the target distribution and can thus be highly non-uniform. However, for light transport simulation or fabrication, a uniform sampling of the target surface is preferable. Therefore the target surface is represented by a uniform triangle mesh $M_T$ of user-specified resolution. Let $v=\{x, n, d_I, x_R\}$ be a vertex of $M_T$, where x is the vertex position, n the corresponding surface normal, $d_I$ the direction of the incoming ray, and $x_R$ the intersection of the outgoing ray with the receiver (see FIG. 6). The positions x and incoming ray directions $d_I$ are initialized from the source surface and incoming illumination, respectively. The target position $x_R$ is retrieved from the OTM. It is noted that the OTM defines a point-wise correspondence between the weighted centroid of each Voronoi cell and the corresponding power cell. To obtain the target position $x_R$ the computed receiver positions are interpolated onto $M_S$ using natural neighbor interpolation [Barnett 1981], as shown in FIG. 7. Since natural neighbor interpolation is only defined within the convex hull of the centroids, an extrapolation is conducted by moving the centroids of boundary cells onto the boundary. This causes a slight deformation at the boundary, but the effect diminishes as the OTM resolution increases. Given an incoming light vector $d_I$ and a target direction $d_T=(x_R-x)/\|(x_R-x)\|$, the desired target surface normal is computed using Snell's law as $\tilde{n}=d_I+\eta x/\|d_I+\eta d_T\|$, where $\eta$ is the ratio of the refraction indices of the two media. It is referred to [Kiser and Pauly 2012] for a derivation of this formula.

3D Optimization

Figure 8:
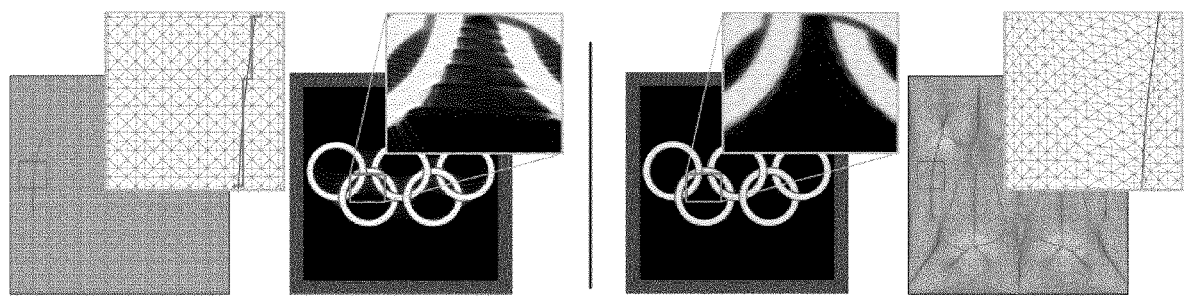

Even though the OTM is curl-free, the normal derived from the corresponding targets are not necessarily integrable, due to the non-linearity introduced by Snell's law. To compute the target surface, we thus formulate an iterative optimization that solves for the target vertex positions by minimizing the following compound energy:

$$\arg_x \min w \cdot [E_{int}; E_{dir}; E_{flux}; E_{reg}; E_{bar}], \quad (5)$$

where w is a weighting vector. The integration energy aligns the vertex normals n of $M_T$ with the target normals ñ derived from the OTM:

$$E_{int} = \sum_{v \in M_T} \|n - \tilde{n}\|_2^2, \quad (6)$$

where n is computed by averaging the normals of incident triangles weighted by the incident angles [Botsch et al. 2010, Pg. 41]. Previous techniques constrain the vertices of $M_T$ to lie on the associated incoming ray direction and therefore only need to solve for a scalar vertex displacement. As illustrated in FIG. 8, this can be problematic, because the mesh cannot adapt to sharp creases caused by discontinuities in the normal field. Therefore the optimization is performed over all spatial coordinates of the mesh to allow vertices to slide along the surface to better represent crease lines. However, to maintain consistency with the OTM, it is necessary to ensure that vertices do not deviate too much from the incoming ray direction. This can be achieved with a penalty term $$E_{dir} = \sum_{v \in M_T} \|x - proj_{(x_S, d_I)}(x)\|_2^2, \quad (7)$$

where $x_S$ is the position of vertex v on the source surface. The projection operator proj returns the point on the line ($x_S$, $d_I$) closest to x. In addition, it is necessary to ensure that the flux over triangle t of $M_T$ remains constant, because the OTM was computed according to this flux. Therefore, a flux preservation energy is inserted for each triangle:

$$E_{flux} = \sum_{t \in M_T} \|\Phi_T(t) - \Phi_S(t_S)\|^2, \quad (8)$$

where $t_S$ is the triangle corresponding to t on the source surface. To maintain well-shaped triangles we add the regularization term:

$$E_{reg} = \|LX\|_2^2, \quad (9)$$

where the vertices of $M_T$ are stacked in X, and L is the corresponding combinatorial Laplacian matrix [Botsch et al. 2010]. Finally, an additional barrier energy is introduced to ensure the physical realizability of the piece by preventing the surface to fall beyond a certain distance $d_{TH}$ from the receiver:

$$E_{bar} = \sum_{v \in M_T} \|f_{bar}(n_R \cdot (x - x_R))\|^2 \quad (10)$$

$$f_{bar}(x) = \max(0, -\log((1-x) + d_{TH})) \quad (11)$$

where $n_R$ is the normal of the receiver plane. The pseudo-code of the target optimization algorithm is provided below.

```
// INPUT:
//          X := vertex positions of M_S
//          R := optimal transport map
// OUTPUT:
//          X := vertex positions of M_T
function X = TARGET-OPTIMIZATION (X, R)
    X_R = OTM-Interpolation(X,R)
    while NotConverged( ) do
        D_T = normalize(XR - X)
        ~N = Fresnel-Mapping(X; D_T )
        X = Normal-Integration(X; ~N)
    end while
end function
```

Equation 5 is solved using the auto-differentiation Levenberg-Marquadt optimization offered by the Ceres framework [Agarwal et al. 2013]. The optimization converges after a few outer iterations of Fresnel Mapping followed by 3D optimization. For all examples, set the weights for $E_{int}$ and $E_{bar}$ are set to 1. For the Einstein, Olympic, and Brain models $1 \times 10^{-6}$ was used for the weight of $E_{dir}$ and no flux energy, while the Siggraph and Lena models are computed with $1 \times 10^{-4}$ for $E_{dir}$ and $1 \times 10^{-3}$ for $E_{flux}$. The results are not particularly sensitive to the choice of these parameters. More difficult to tune is the weight for regularization term $E_{reg}$ (values between $1 \times 10^{-6}$ and $1 \times 10^{-4}$ are selected in the examples). If chosen too low, triangle inversions might occur that lead to an inconsistent surface. On the other hand, if the weight is too high, a deviation from the optimal solution arises, which introduces distortions in the caustic image. It is intended to investigate more sophisticated regularization terms that prevent triangle inversions without negatively affecting the other objectives in the future.

EXAMPLES

In the following section several simulated results and physical prototypes computed by the optimization algorithm are presented. The approximation quality with a ground truth example is evaluated, a solution is compared to previous methods, and comments with regard to limitations of the present approach will be given. All light transport simulations have been generated using the physics-based rendering software LuxRender. The physical prototypes are fabricated in acrylic (PMMA, IOR: 1.49) with a CNC milling machine.

Figure 1:
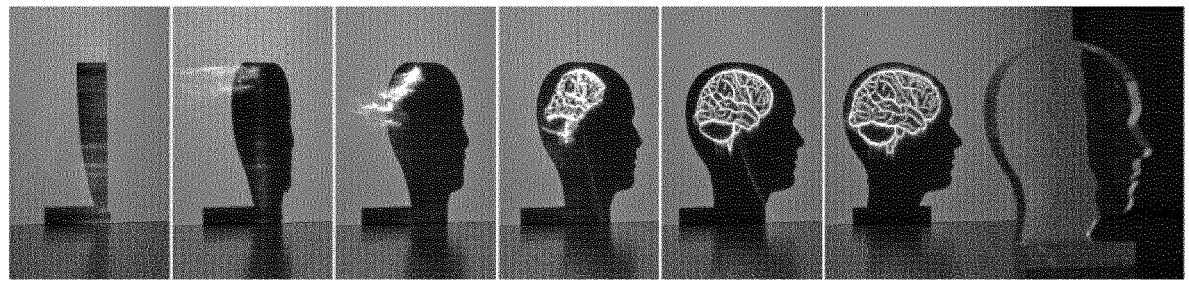
Figure 9:
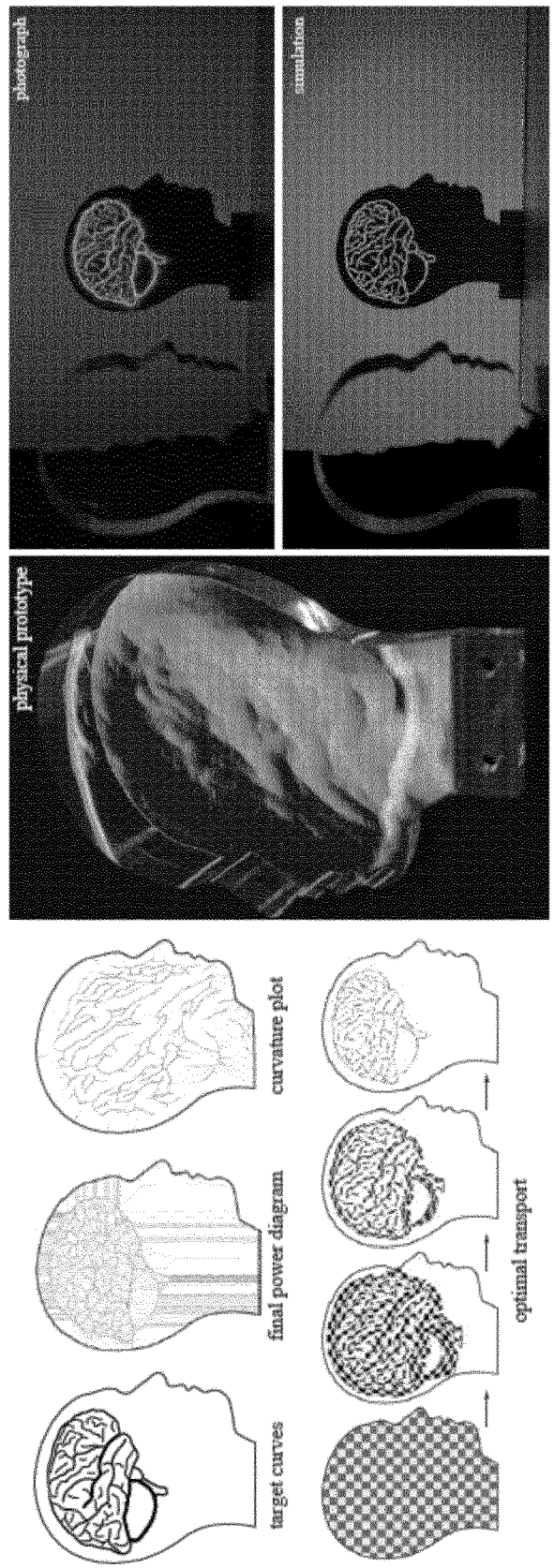
FIG. 9 shows a caustic generator of a brain, wherein the target distribution is composed of a number of singularity curves (left), and a comparison of the physical prototype with a light transport simulation computed with LuxRender with roughly the same camera and light source parameters (right)

FIGS. 1 and 9 show a example on a freeform domain. The high concentration of uniform light onto a complex network of singular curves of varying intensity and separated by black regions, is achieved through numerous discontinuities in the OTM.

FIG. 9 shows the caustic generator of a brain. The target distribution is composed of a number of singularity curves, where the line thickness indicates the relative flux density of each line. Computed from an initial uniform sampling, the final power diagram (¼ the sample size for better readability) illustrates the highly non-uniform discretization necessary to match the target. The second row shows how a set of regularly sampled points is transported under the OTM. On the right, a comparison of the physical prototype with a light transport simulation computed with LuxRender with roughly the same camera and light source parameters.

Figure 10:
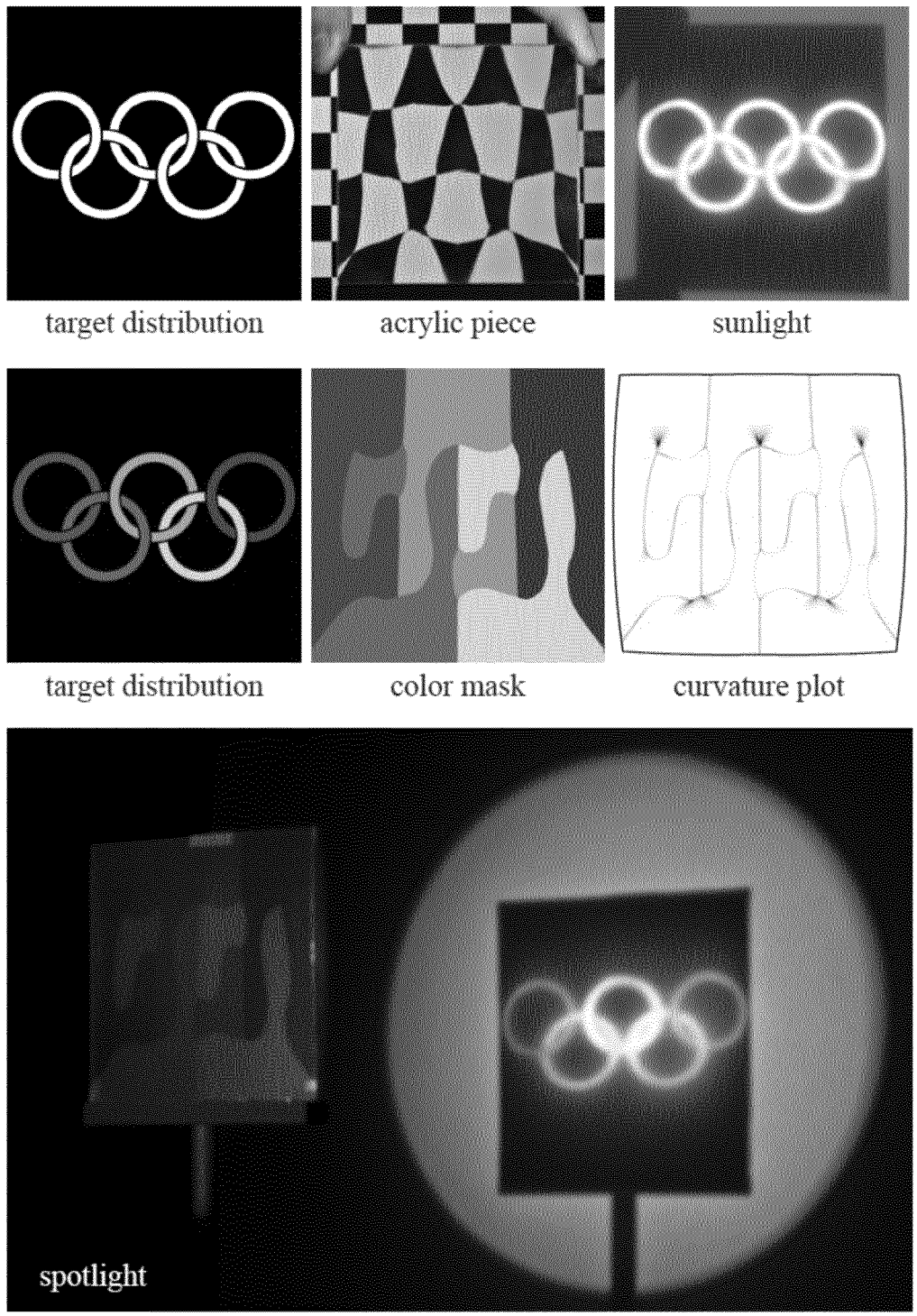
FIG. 10 shows a caustic image of the olympic rings photographed under sunlight (top right) and a spotlight (bottom) with a color mask computed from the OTM.

FIG. 10 shows another high contrast caustic with completely black interior and exterior regions. The distortion of the checkerboard illustrates the strong refraction of the caustic generator. A simple extension allows for colored caustics. If the target distribution is wavelength-dependent, e.g. given by a color image, create a corresponding semi-transparent color filter on the caustic generator can be generated based on the OTM. The resulting color mask illustrates how the incoming illumination is distributed towards the different rings. It is apparent that no light is lost to the background in these examples (see also FIG. 13). This kind of effect can only be achieved by adequate handling of discontinuities.

Figure 11:
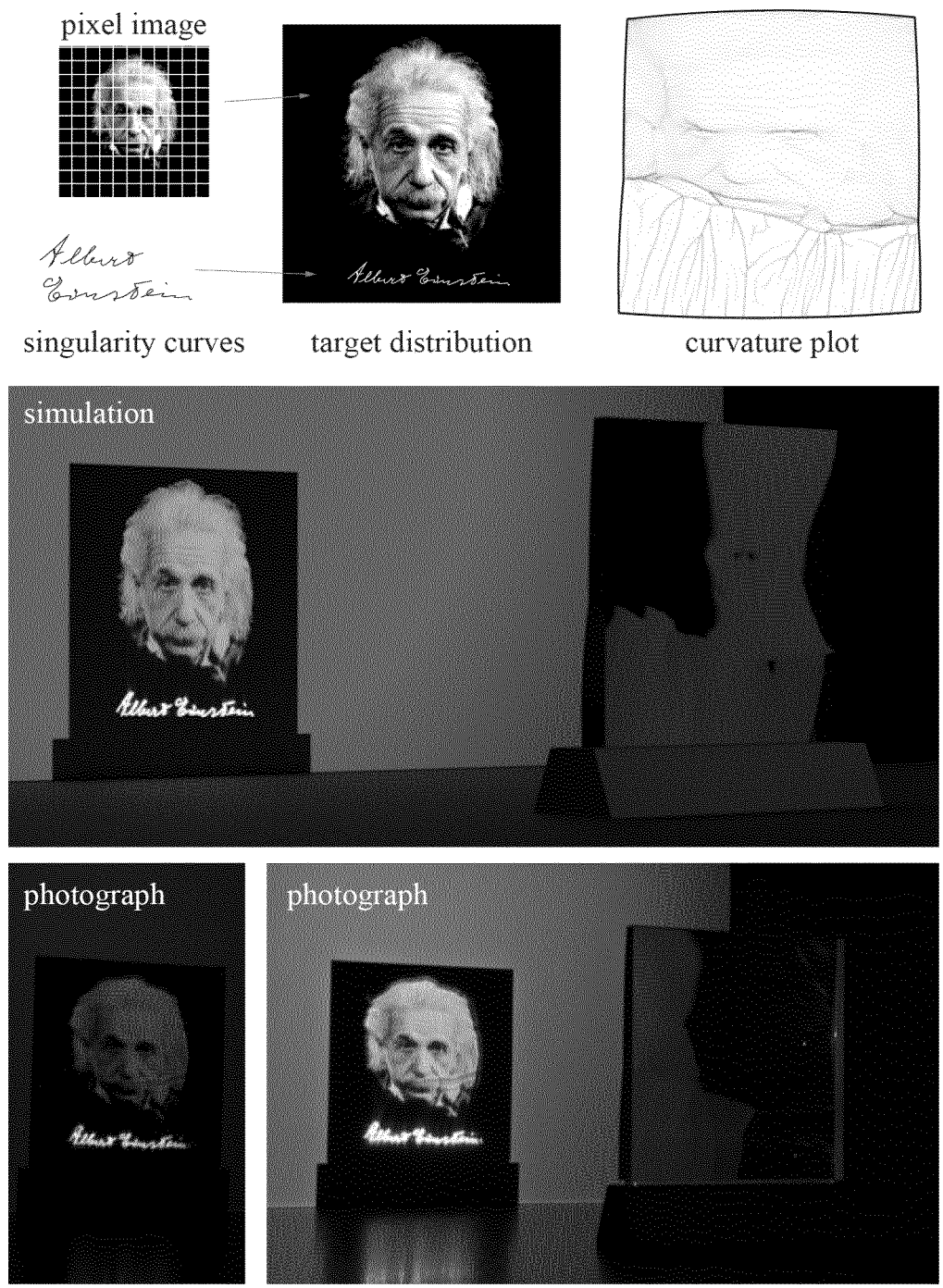
FIG. 11 shows a signed portrait of Albert Einstein, wherein a pixel image is combined with several singularity curves for the signature to define the target distribution.

FIG. 11 combines a smooth image with high-intensity singularity lines. For the signed portrait of Albert Einstein a pixel image is combined with several singularity curves for the signature to define the target distribution. The total flux of the curves has been chosen as half the total flux of the image, which is reflected in the area distribution visible in the curvature plot.

An exposure time of half a second (bottom left) and two seconds (bottom right) has been used in the photographs to show the high dynamic range of the caustic image. The setup for each example is listed below:

| Image | Mesh size | OT samples | Physical size | $d_{TH}$ |
|---|---|---|---|---|
| EINSTEIN | $641^2$ | 261k | 10 cm$^2$ | 30 cm |
| OLYMPIC | $641^2$ | 261k | 10 cm$^2$ | 30 cm |
| BRAIN | $641^2$ | 163k | 11.5 × 13.5 cm | 40 cm |
| SIGGRAPH | $641^2$ | 254k | 10 cm$^2$ | 30 cm |
| LENA | $1281^2$ | 1.3m | 10 cm$^2$ | 10 cm |

Thanks to the multi-scale approach of the OTM optimization, a roughly linear complexity is empirically observed in the number of input samples. However, each iteration requires a re-computation of the power diagram using exact arithmetic, which is computationally involved. For the example in FIG. 10, it took 4 minutes for 16 thousand points, 25 minutes for 66 thousand points, and 95 minutes for 260 thousand points. The 3D target optimization takes between a few minutes for a mesh of size 321×321 to about 15 minutes for a 641×641 mesh. All reported results are produced using a 2013 MacBook Pro. For the largest test case several hours of compute time were necessary to calculate the surface of a caustic generator of 1.5 million samples. More than 90% of the time is devoted to the optimal transport computation of which 99% of the time is spent recomputing the power diagram in each iteration. However, depending on the complexity of the target distribution, already significantly fewer samples suffice to achieve good results as listed in the figure captions.

Figure 3:
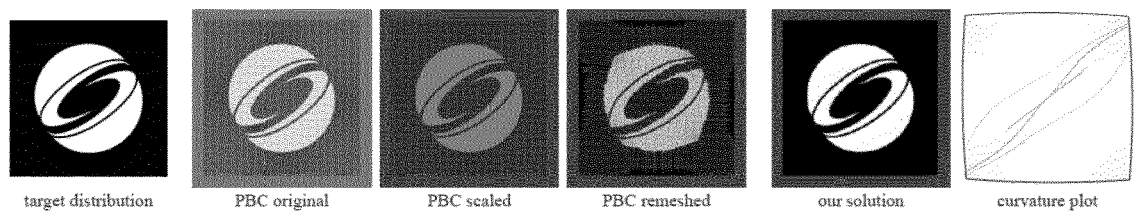
Figure 12:
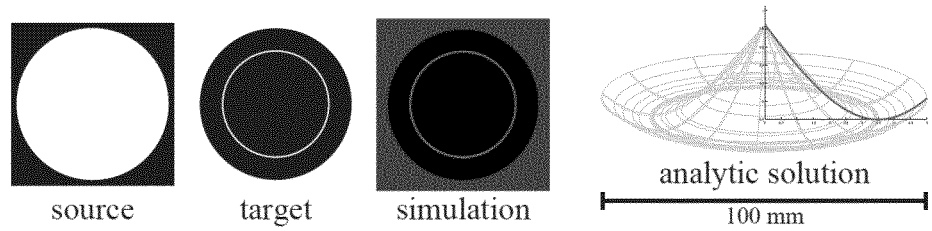
FIG. 12 shows a ground truth evaluation, wherein a disk of uniform light is focused onto a circular singularity curve by a hat shaped surface that can be computed in analytical form, where all errors are in mm and the simulation shows the rendered caustic corresponding to the top right error plot.
Figure 12:
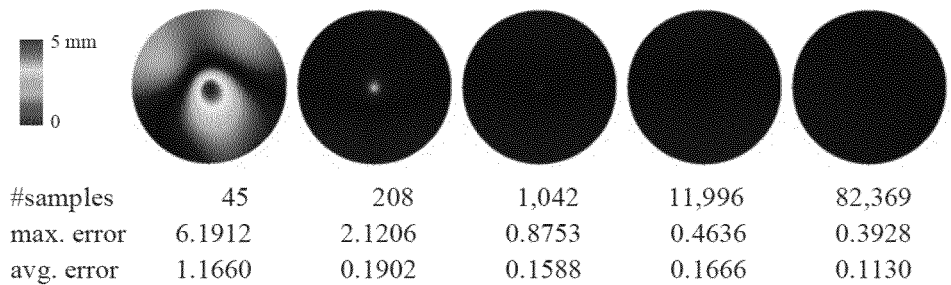
Figure 12:
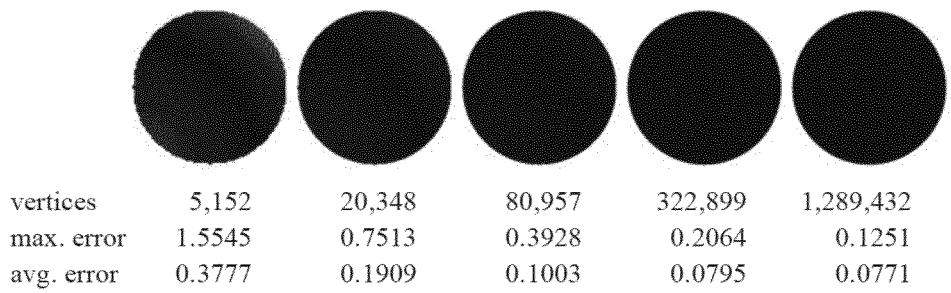
Figure 12:
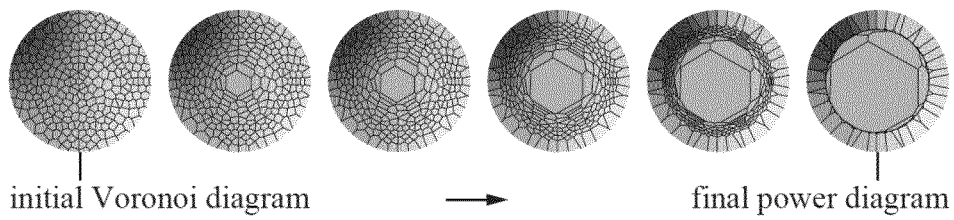
Figure 13:
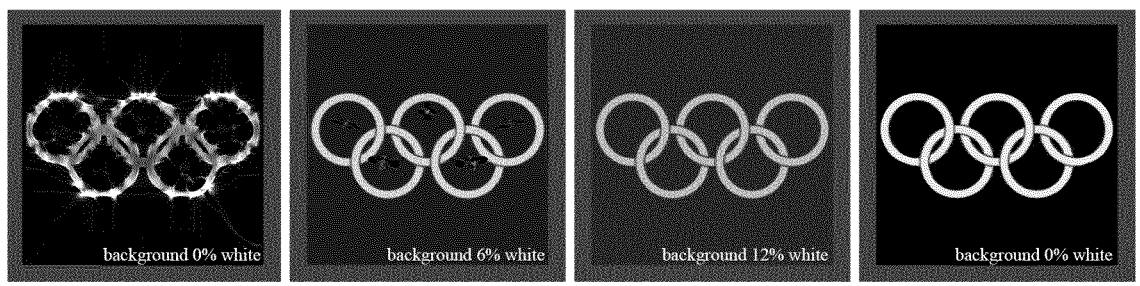
FIG. 13 shows a comparison of the present approach to the approach of [Kiser et al. 2012]
Figure 14:
FIG. 14 shows that for a smooth image like the "Lena"-image, the performance of the present algorithm is comparable to the one of state-of-the-art algorithms, wherein for comparison, images have been histogram-equalized to the input image.

FIG. 12 illustrates how the optimization approximates a ground truth result when increasing the resolution. For this example, uniform incident illumination on a circular domain is projected onto a uniform circular singularity curve centered at the origin. Through symmetry it can be seen that under optimal transport each radial line is mapped to the corresponding closest point on the circle. For such a line, an analytic solution using Snell's law can be derived that can then be radially swept to obtain the ground truth 3D shape of the generator. As the results indicate, the present solution quickly approaches to the ground truth under refinement. FIGS. 13 and 3 show a comparison of the present method to the methods of [Kiser et al. 2012] and [Yue et al. to appear], respectively. These methods achieve the highest quality caustic images to date. Both algorithms are similar in that they use fixed boundary conditions and enforce smoothness of the generator surface everywhere. While suitable for low contrast images, where both achieve excellent results (see FIG. 14), these constraints lead to visible artifacts when aiming for high-contrast images or black regions. These artifacts can only be avoided by artificially reducing contrast. In FIGS. 3 and 13 this is achieved by increasing the brightness of the background to a point where a substantial amount of light is "lost" for the actual caustic image. In contrast, the present solution can harvest all light and supports completely black regions anywhere on the caustic. However, the adaptive discretization of the optimal transport algorithm comes at the price of increased computational overhead (see statistics above). The methods of [Kiser et al. 2012] and [Yue et al. to appear] that optimize on a regular grid are about 10 times faster, and therefore may still be preferable for low contrast images. As is visible in FIG. 13, the method of [Kiser et al. 2012] exhibits strong distortions for a black background (left). These artifacts can be reduced by brightening the background at the cost of reduced contrast. The artifacts disappear completely at about 12% white background, but now only 50% of the total incident illumination is focused on the rings. The gray border indicates the intensity of the uniform input illumination. All brightness warping results have been generated by the authors of [Kiser et al. 2012].

A key aspect of the present algorithm is that optimal transport automatically determines where discontinuities in the normal field should occur. Instead of having discontinuities everywhere as in [Weyrich et al. 2009; Papas et al. 2011], or no discontinuities anywhere as in [Kiser et al. 2012; Yue et al. to appear], the present method strikes a balance that achieves superior image quality, while not imposing unnecessary restrictions on the achievable caustic images. While the present optimization supports singularities in the target distribution, physical models will always deviate from the perfect surface and blur out singularities to finite areas (see FIGS. 1 and 9). Explicitly modeling singularities is still useful, because it provides a more principled and complete mathematical formulation and avoids having to manually select the spatial width of high-intensity curves in a pixel grid. This could lead to excessive resolution of the input image and thus substantially increase computational cost. The simplifying assumptions discussed in Section 2 incur a number of limitations of our approach. Area light sources, such as the sun, violate the assumption of a single incident light direction for each surface point. In general, this introduces blur in the caustic image, similar to the blur of shadow boundaries that cannot be avoided completely. Further blurring is introduced by imperfect specular scattering and machining imprecisions. Despite the accumulative nature of these effects, the prototypes produced with the present method convey that physical realizations maintain the overall quality of the target caustic images. The optimization does not take into account potential self-shadowing, internal reflections, or physical limits of refraction. If the angle of the incident illumination on the source surface becomes too shallow, or the target normal deviates too strongly from the source normal, artifacts will occur.

The present method solves for one specific mapping defined by the unique optimal transport map. While this mapping has several important benefits in terms of regularity and smoothness of the resulting caustic generator surface (see also the discussion in Section 4), potentially many other mappings exist for a specific target that might have interesting properties. For example, the optimal transport map by construction avoids fold-overs, which makes the caustic image rather stable under changes in the spatial configuration, e.g. when translating or rotating the piece with respect to the receiver (see also FIG. 1). If a more fragile caustic image that exhibits more dynamic behavior is desired, mappings with fold-overs might be advantageous.

The invention provides a powerful new tool for caustic design by an optimal transport formulation in combination with an iterative 3D optimization. The present method yields significantly better results for high-contrast caustics. This is achieved by explicit modeling of singularities and automatic placement of discontinuities in the surface normals, made possible by an adaptive discretization that conforms to the target irradiance distribution. As a consequence, the present method significantly broadens the kind of caustic images that can be produced, attaining a new visual quality not possible before.

A number of modifications can be provided without leaving the scope of the invention. The embodiment as described above includes several separate functional sections including the sections Singularities, Target, Optimal Transport, Continuous Optimal Transport, Discrete Optimal Transport, Discontinuities, Target Optimization, OTM Interpolation, 3D Optimization as described above. It is apparent that the described embodiment is just an example and it is noted that other embodiments are explicitly included that comprise only a combination of certain functional sections but not all of the sections. For example, embodiments can be realized that include only a certain number of these functional sections, while others are omitted. For example, a reflective or refractive surface or object can be produced that does not include singularities or discontinuities depending on the desired target image. Furthermore, it can be considered to provide a method that does not involve a 3D Optimization.

The present solution can serve as the basis for a number of future explorations. Modifications may include extending the caustic design process to handle multiple source surfaces, consider the dynamics of caustics as the spatial configuration changes, or optimizing for multiple caustic images in a single object. More generally, the present optimization algorithm is an example of performative form-finding: find a geometric shape that maximizes some per formative goal, in our case the reproduction of a desired caustic image. This kind of optimization has many other potential applications, for example in geometry or image editing, digital fabrication, or physical simulation. The unique benefits of the optimal transport formulation can potentially be transferred to these domains, opening up numerous new research questions for computer graphics and related fields.

REFERENCES

AGARWAL, S., MIERLE, K., AND OTHERS, 2013. Ceres solver: https://code.google.com/p/ceres-solver/.
AURENHAMMER, F., HOFFMANN, F., AND ARONOV, B. 1998. Minkowski-type theorems and least-squares clustering. Algorithmica 20, 1, 61-76.
BARNETT, V., Ed. 1981. Interpreting multivariate data, Wiley series in probability and mathematical statistics, Wiley.
BOGACHEV, V. I. 2006. Measure theory. Springer.
BOTSCH, M., KOBBELT, L., PAULY, M., ALLIEZ, P., AND L'E VY, B. 2010. Polygon Mesh Processing. Ak Peters Series. A K Peters.
CHODOSH, O., JAIN, V., LINDSEY, M., PANCHEV, L., AND RUBINSTEIN, Y. A. 2013. On discontinuity of planar optimal transport maps. arXiv/1312.2929.
DE GOES, F., BREEDEN, K., OSTROMOUKHOV, V., AND DESBRUN, M. 2012. Blue noise through optimal transport. ACM Transactions on Graphics (TOG) 31, 6, 171.
FANG, F., ZHANG, X., WECKENMANN, A., ZHANG, G., AND EVANS, C. 2013. Manufacturing and measurement of freeform optics. {CIRP} Annals—Manufacturing Technology 62, 2.
FINCKH, M., DAMMERTZ, H., AND LENSCH, H. P. 2010. Geometry construction from caustic images. In Computer Vision—ECCV 2010. Springer, 464-477.
GLIMM, T., AND OLIKER, V. 2003. Optical design of single reflector systems and the monge-kantorovich mass transfer problem. Journal of Mathematical Sciences 117, 3.
HULLIN, M. B., IHRKE, I., HEIDRICH, W., WEYRICH, T., DAMBERG, G., AND FUCHS, M. 2013. Computational fabrication and display of material appearance. In Eurographics State-of-the-Art Report.
KISER, T., AND PAULY, M. 2012. Caustic art. In EPFL Technical Report.
KISER, T., EIGENSATZ, M., NGUYEN, M. M., BOMPAS, P., AND PAULY, M. 2012. Architectural caustics—controlling light with geometry. In Advances in Architectural Geometry, Springer.
LIU, D. C., AND NOCEDAL, J. 1989. On the limited memory bfgs method for large scale optimization. Mathematical programming 45, 1-3, 503-528.
MERIGOT, Q. 2011. A multiscale approach to optimal transport. In Computer Graphics Forum, vol. 30, Wiley Online Library, 1583-1592.
PAPAS, M., JAROSZ, W., JAKOB, W., RUSINKIEWICZ, S., MATUSIK, W., AND WEYRICH, T. 2011. Goal-based caustics. Computer Graphics Forum 30, 2, 503-511.
PATOW, G., AND PUEYO, X. 2005. A survey of inverse surface design from light transport behavior specification. In Computer Graphics Forum, vol. 24, Wiley Online Library, 773-789.
PHILIPPIS, G. D., AND FIGALLI, A. 2013. The mongeampere equation and its link to optimal transport. preprint, available at http://arxiv.org/abs/1310.6167.
VILLANI, C. 2009. Optimal transport: old and new. Springer Verlag.
WEYRICH, T., PEERS, P., MATUSIK, W., AND RUSINKIEWICZ, S. 2009. Fabricating microgeometry for custom surface reflectance. ACM Transactions on Graphics (TOG) 28, 3, 32.
YUE, Y., IWASAKI, K., CHEN, B.-Y., DOBASHI, Y., AND NISHITA, T. 2012. Pixel art with refracted light by rearrangeable sticks. Comp. Graph. Forum 31, 2pt 3 (May), 575-582.
YUE, Y., IWASAKI, K., CHEN, B.-Y., DOBASHI, Y., AND NISHITA, T. to appear. Poisson-based continuous surface generation for desired caustics. ACM Transactions on Graphics.
YVINEC, M. 2013. 2D triangulations. In CGAL User and Reference Manual, 4.3 ed. CGAL Editorial Board.
ZHANG, Z., AND ZHENG, X. 2012. The Representation of Line Dirac Delta Function Along a Space Curve. ArXiv e-prints (September)

The invention claimed is:

1. A method of designing a refractive surface, comprising:
providing an initial geometry of a refractive object having a refractive surface with an initial shape;
determining a refraction of incident illumination through the refractive surface with the initial shape at vertices of a mesh into which the refractive surface of the refractive object has been discretized to create a source irradiance $E_S$ distribution on a receiver;
determining a target shape of the refractive surface of the refractive object such that a target irradiance $E_T$ distribution on the receiver created by refraction of the incident illumination through the refractive surface with the target shape matches a desired target image provided by a user, wherein determining the target shape of the refractive surface comprises determining an optimal transport map (OTM) from the entire source irradiance $E_S$ distribution on the receiver to the entire target irradiance $E_T$ distribution on the receiver, the optimal transport map encoding how the entire source irradiance $E_S$ distribution of light on the receiver needs to be modified with a minimized total transport cost for a moving of vertices of the mesh to obtain the entire target irradiance $E_T$ distribution on the receiver that matches the desired target image, wherein modifying the entire source irradiance $E_S$ distribution of light on the receiver comprises moving the vertices of the mesh so that any modifications of the directions of the refracted light rays of the entire source irradiance $E_S$ distribution on the receiver that are required according to the OTM are determined such that overall the modifications of the directions of the refracted light rays are done with the smallest possible extent to obtain the entire target irradiance $E_T$ distribution on the receiver and the target shape of the refractive surface, thereby limiting the change in curvature of the refractive surface with the target shape; and providing the refractive object having the refractive surface with the target shape.

2. The method according to claim 1,
wherein determining the refraction of incident illumination through the refractive surface with the initial shape to create the source irradiance $E_S$ distribution on the receiver comprises tracing of rays of the incident illumination through the refractive surface of the refractive object with the initial geometry.

3. The method according to claim 2,
wherein determining the target shape of the refractive surface of the refractive object comprises determining an optimized shape of the refractive surface.

4. The method according to claim 3, further including:
determining a target position $x_R$ on the receiver for each light ray that leaves the refractive surface of the refractive object such that the overall irradiance distribution closely matches the target irradiance $E_T$;
determining normals on the refractive surface of the refractive object using Snell's law; and
integrating the normals to obtain the optimized target surface.

5. The method according to claim 3, further including:
representing incident illumination on the refractive surface of the refractive object as a triangle mesh $M_T$ on the refractive surface, where each vertex comprises an incoming direction and an intensity value of a ray;
tracing of the rays through the refractive surface at the vertices of the triangle mesh $M_T$ onto the receiver to obtain a piecewise linear representation of the source irradiance $E_S$ on the receiver, wherein each site $s_i$ of a set S of sites on the receiver approximately represents the same amount of flux;
discretizing a domain U including the set S of sites comprising generating a Voronoi diagram of S; and
determining how each Voronoi cell $C_i$ of the Voronoi diagram needs to be deformed and moved such that its flux $\Phi_i$ is distributed to match the desired target distribution $E_T$.

6. The method according to claim 5, further comprising:
representing the target irradiance distribution $E_T$ as a power diagram of the sites S by determining a set of weights $\omega = (\{\omega_1, \ldots, \omega_n\}$ of the power diagram that best match the target irradiance distribution $E_T$.

7. The method according to claim 6,
wherein the set of weights $\omega$ are determined by finding a global minimizer of the function:

$$f(\omega) = \sum_{s_i \in S} \left( \omega_i \mu_S(C_i^0) - \int_{C_i^\omega} (\|x - s_i\|^2 - \omega_i) d\mu_T(x) \right)$$

where $\mu_S$ and $\mu_T$ are defined as $$\mu_S(\Omega) := \frac{\Phi_S(\Omega)}{\Phi_S(U)}, \mu_T(\Omega) := \frac{\Phi_T(\Omega)}{\Phi_T(U)}$$

where $\Phi_S$ is source radiant flux, $\Phi_T$ is target radiant flux, and x is $x_R$.

8. The method according to claim 5,
wherein determining the target shape of the refractive surface of the refractive object comprises:
a) discretizing the refractive surface of the refractive object with the triangle mesh $M_T$ that is initialized on the refractive surface of the refractive object with the initial geometry;
b) determining normals on the surface of the refractive object for each vertex of the triangle mesh $M_T$ using Snell's law from the target positions $x_R$ on the receiver for each light ray as derived from the OTM;
c) moving the vertices of the triangle mesh $M_T$ to best match the target surface normals while respecting the flux densities $\Phi$;
d) iterating b) and c); and
e) integrating the normals on the surface of the refractive object.

9. The method according to claim 8,
wherein the target positions $x_R$ where a ray impinges on the receiver is derived from the OTM by natural neighbor interpolation of the OTM on the triangle mesh MI.

10. The method according to claim 8,
wherein moving the vertices of the triangle mesh $M_T$ to best match the target surface normals comprises minimizing the compound energy defined by:

$$\arg_x \min w \cdot [E_{int}, E_{dir}, E_{flux}, E_{reg}, E_{bar}],$$

where w is a weighting factor and the integration energy $E_{int}$ aligns the vertex normal i of the triangle mesh $M_T$ with the target normals n derived from the OTM:

$$E_{int} = \sum_{v \in M_T} \|n - \tilde{n}\|_2^2,$$

where v is the vertices of the triangle mesh $M_T$,
where n is determined by averaging the normal of incident triangles weighted by the incident angles,
where $E_{dir}$ is incoming ray direction,
where $E_{flux}$ is a flux preservation energy,
where $E_{reg}$ is a regularization term, and
where $E_{bar}$ is an additional barrier energy.

11. The method according to claim 8,
wherein respecting the flux densities Φ comprises maintaining the flux constant over a cell of the triangle mesh $M_T$ constant.

12. The method according to claim 8, further comprising:
introducing discontinuities in the field of normals on the surface of the refractive object at chosen locations.

13. The method according to claim 1, further comprising:
including at least one of one or more point singularities and curve singularities of infinite light density in the target flux distribution $\Phi_T$, $$\Phi_T(\Omega) = \sum_{i=1}^{N_\delta} \Phi_0^i(\Omega) + \sum_{j=1}^{N_\gamma} \Phi_1^j(\Omega) + \Phi_2(\Omega)$$

wherein flux and irradiance are related as $\Phi(\Omega) = \int_\Omega E(x,y)dxdy$ for any subset $\Omega \subseteq \mathbb{R}^2$,
including functions $\Phi_0$, $\Phi_1$, and $\Phi_2$ for point singularities, curve singularities, and area distributions, respectively, where $N_\delta$ is number of point singularities, $N_\gamma$ is number of curve singularities wherein a point singularity $\delta$ is specified by a position $x_\delta \in U$ and a flux $\Phi_\delta$ such that $$\Phi_0(\Omega) = \begin{cases} \Phi_\delta & \text{if } x_\delta \in \Omega \\ 0 & \text{otherwise} \end{cases}$$

wherein a curve singularity is represented by a curve $c:[0, L] \to \mathbb{R}^2$ and a curve density function $f:[0, L] \to \mathbb{R}$, where c is parameterized with respect to arc length and L is the total length of c such that $$\Phi_1(\Omega) = \int_0^L f_\Omega(t)dt,$$

where is $f_\Omega$ the restriction of f onto $\Omega$:

$$f_\Omega = \begin{cases} f(t) & \text{if } c(t) \in \Omega \\ 0 & \text{otherwise} \end{cases}$$

and $$\Phi_2(\Omega) = \int_\Omega E(x, y)dxdy$$

where $E:U \to \mathbb{R}$ is an integrable 2D irradiance function.

14. A reflective object, comprising:
at least one refractive or reflective surface that is designed according to the method of claim 1.

15. The reflective object according to claim 14,
wherein the reflective object is illuminated with a point light source or a homogeneous light source emitting collimated light.

16. A non-transitory computer readable medium comprising instructions which when executed by a computer carry out a method of designing a refractive surface, comprising:
providing an initial geometry of a refractive object having a refractive surface with an initial shape;
determining a refraction of incident illumination through the refractive surface with the initial shape at vertices of a mesh into which the refractive surface of the refractive object has been discretized to create a source irradiance $E_S$ distribution on a receiver;
determining a target shape of the refractive surface of the refractive object such that a target irradiance $E_T$ distribution on the receiver created by refraction of the incident illumination through the refractive surface with the target shape matches a desired target image provided by a user;
wherein determining the target shape of the refractive surface comprises determining an optimal transport map (OTM) from the entire source irradiance $E_S$ distribution on the receiver to the entire target irradiance $E_T$ distribution on the receiver, the optimal transport map encoding how the entire source irradiance $E_S$ distribution of light on the receiver needs to be modified with a minimized total transport cost for a moving of vertices of the mesh to obtain the entire target irradiance $E_T$ distribution on the receiver that matches the desired target image, wherein modifying the entire source irradiance $E_S$ distribution of light on the receiver comprises moving the vertices of the mesh of vertices so that any modifications of the directions of the refracted light rays of the entire source irradiance $E_S$ distribution on the receiver that are required according to the OTM are determined such that overall the modifications of the directions of the refracted light rays are done with the smallest possible extent to obtain the entire target irradiance $E_T$ distribution on the receiver the target shape of the refractive surface, thereby limiting the change in curvature of the refractive surface with the target shape; and
providing the refractive object having the refractive surface with the target shape.

17. The method according to claim 1,
wherein the incident illumination is from a point light source or a homogeneous light source emitting collimated light.

* * * * *

UNITED STATES PATENT AND TRADEMARK OFFICE
CERTIFICATE OF CORRECTION

PATENT NO. : 10,732,405 B2  
APPLICATION NO. : 15/323645  
DATED : August 4, 2020  
INVENTOR(S) : Mark Pauly, Romain P. Testuz and Yuliy Schwartzburg Page 1 of 1

It is certified that error appears in the above-identified patent and that said Letters Patent is hereby corrected as shown below:

In the Specification

Column 14,
Line 8, "$D_T$ = normalize(XR - X)" should read --$D_T$ = normalize($X_R$ - X)--.

In the Claims

Column 20,
Line 53, "vertex normal i" should read --vertex normal ñ--.

Signed and Sealed this
Fifteenth Day of February, 2022

Drew Hirshfeld
*Performing the Functions and Duties of the*
*Under Secretary of Commerce for Intellectual Property and*
*Director of the United States Patent and Trademark Office*